US009924598B2

(12) United States Patent
Hachiya

(10) Patent No.: US 9,924,598 B2
(45) Date of Patent: Mar. 20, 2018

(54) ELECTRONIC CONTROL DEVICE AND PRODUCTION METHOD THEREOF

(71) Applicant: AISAN KOGYO KABUSHIKI KAISHA, Obu-shi, Aichi-ken (JP)

(72) Inventor: Masahiro Hachiya, Chita (JP)

(73) Assignee: AISAN KOGYO KABUSHIKI KAISHA, Obu-Shi, Aichi-Ken (JP)

(*) Notice: Subject to any disclaimer, the term of this patent is extended or adjusted under 35 U.S.C. 154(b) by 257 days.

(21) Appl. No.: 15/063,076

(22) Filed: Mar. 7, 2016

(65) Prior Publication Data
US 2016/0278213 A1   Sep. 22, 2016

(30) Foreign Application Priority Data

Mar. 18, 2015   (JP) ................ 2015-054865

(51) Int. Cl.
*H01R 9/00*    (2006.01)
*H05K 1/18*    (2006.01)
*H05K 3/30*    (2006.01)
*H05K 3/00*    (2006.01)
*H05K 3/32*    (2006.01)

(52) U.S. Cl.
CPC .............. *H05K 1/18* (2013.01); *H05K 3/301* (2013.01); *H05K 3/0014* (2013.01); *H05K 3/328* (2013.01); *H05K 2201/09118* (2013.01); *H05K 2201/10272* (2013.01)

(58) Field of Classification Search
CPC ........... H05K 1/18; H05K 2201/09118; H05K 2201/10272; H05K 3/0014; H05K 3/301; H05K 3/328
See application file for complete search history.

(56) References Cited

U.S. PATENT DOCUMENTS

| 5,877,548 A * | 3/1999 | Washida ........... H01L 23/49541 257/666 |
| 6,325,640 B1 * | 12/2001 | Kasai .................. H01R 25/168 174/71 B |
| 8,217,265 B2 * | 7/2012 | Shimizu ................ H02G 3/086 174/133 B |
| 8,559,167 B1 * | 10/2013 | Czarnecki ................ H02B 1/46 174/50 |
| 8,743,532 B2 * | 6/2014 | Yano .................... H02B 13/025 165/104.33 |
| 8,835,760 B2 * | 9/2014 | Saimoto ................ H01R 13/42 174/50 |

(Continued)

FOREIGN PATENT DOCUMENTS

JP    H10-12790 A    1/1998
JP   2002-118926 A   4/2002

(Continued)

*Primary Examiner* — Yuriy Semenenko
(74) *Attorney, Agent, or Firm* — Conley Rose, P.C.

(57) ABSTRACT

An electronic control device includes a wiring unit made from a resin material and an integrated circuit placed on the wiring unit. The wiring unit has a conductive member partially buried therein and including a bus bar terminal and a wiring part extending along a basal plane. The bus bar terminal is bent to extend in a first direction intersecting the basal plane. The integrated circuit includes a lead directed away from the basal plane and connected to the bus bar terminal.

11 Claims, 5 Drawing Sheets

(56) References Cited

U.S. PATENT DOCUMENTS

| | | | | |
|---|---|---|---|---|
| 2004/0001319 A1* | 1/2004 | Kawakita | ............ | H05K 1/0263 |
| | | | | 361/715 |
| 2005/0136708 A1* | 6/2005 | Shimoda | ................ | H01R 9/226 |
| | | | | 439/76.2 |
| 2008/0157680 A1* | 7/2008 | Tominaga | ................ | H05K 3/32 |
| | | | | 315/112 |
| 2009/0294195 A1* | 12/2009 | Otsuka | ................... | B60K 6/405 |
| | | | | 180/65.275 |

FOREIGN PATENT DOCUMENTS

| JP | 2004-120838 A | 4/2004 |
|---|---|---|
| JP | 2009-206184 A | 9/2009 |

\* cited by examiner

US 9,924,598 B2

ELECTRONIC CONTROL DEVICE AND PRODUCTION METHOD THEREOF

CROSS-REFERENCE TO RELATED APPLICATIONS

This application claims priority to Japanese patent application serial number 2015-054865, filed Mar. 18, 2015, the contents of which are incorporated herein by reference in their entirety for all purposes.

STATEMENT REGARDING FEDERALLY SPONSORED RESEARCH OR DEVELOPMENT

Not applicable.

BACKGROUND

This disclosure relates to an electronic control device and a production method thereof. In particular, the electronic control device includes a wiring unit, in which a conductive member is partially buried, and electronic components connected to the wiring unit.

Japanese Laid-Open Patent Publication No. 2002-118926 discloses a conventional electronic control device having a wiring unit, which is made of a resin material and includes a conductive member. The conductive member is integrally molded in the wiring unit and serves as a part of an electronic circuit of the wiring unit. The electronic control device includes some electronic components connected to the wiring unit. A connection process between the wiring unit and the electronic components is usually carried out by electrically contacting a terminal of each electronic component with a corresponding connection terminal of the wiring unit and then coupling them to each other by soldering, welding or the like.

In a manufacture of such an electronic control device, there is a possibility that a position of the connection terminal of the wiring unit and a position of the terminal of the electronic component deviate from their predetermined positions significantly. Thus, in such case, it is difficult to couple the connection terminal of the wiring unit to the terminal of the electronic component. Accordingly, there is a need for an improved electronic control device.

BRIEF SUMMARY

In one aspect of this disclosure, an electronic control device includes a wiring unit made from a resin material and an integrated circuit placed on the wiring unit. The wiring unit has a conductive member partially buried therein and including a bus bar terminal and a wiring part extending along a basal plane. The bus bar terminal is bent to extend in a first direction intersecting the basal plane. The integrated circuit includes a lead directed away from the basal plane and connected to the bus bar terminal at a position distant from the basal plane.

According to the aspect of this disclosure, the bus bar terminal is bent in the first direction intersecting the basal plane of the conductive member. Thus, it is able to hold the conductive member within a molding die during insert molding of the wiring unit by engaging the bus bar terminal with the molding die, so that positional deviation of the bus bar terminal with respect to the wiring unit can be reduced. Accordingly, a loose connection between the bus bar terminal and the lead and/or application of excessive force to the integrated circuit via the lead is prevented. Further, because the lead of the integrated circuit is directed away from the basal plane, the lead is connected to the bus bar terminal at an upper side of the wiring unit. Hence, connection process of the lead to the bus bar terminal can be easily performed.

DETAILED DESCRIPTION

Each of the additional features and teachings disclosed above and below may be utilized separately or in conjunction with other features and teachings to provide improved electronic control device. Representative examples, which utilize many of these additional features and teachings both separately and in conjunction with one another, will now be described in detail with reference to the attached drawings. This detailed description is merely intended to teach a person of skilled in the art further details for practicing preferred aspects of the present teachings and is not intended to limit the scope of the invention. Only the claims define the scope of the claimed invention. Therefore, combinations of features and steps disclosed in the following detailed description may not be necessary in the broadest sense, and are instead taught merely to particularly describe representative examples. Moreover, various features of the representative examples and the dependent claims may be combined in ways that are not specifically enumerated in order to provide additional useful embodiments of the present teachings.

Figure 1:
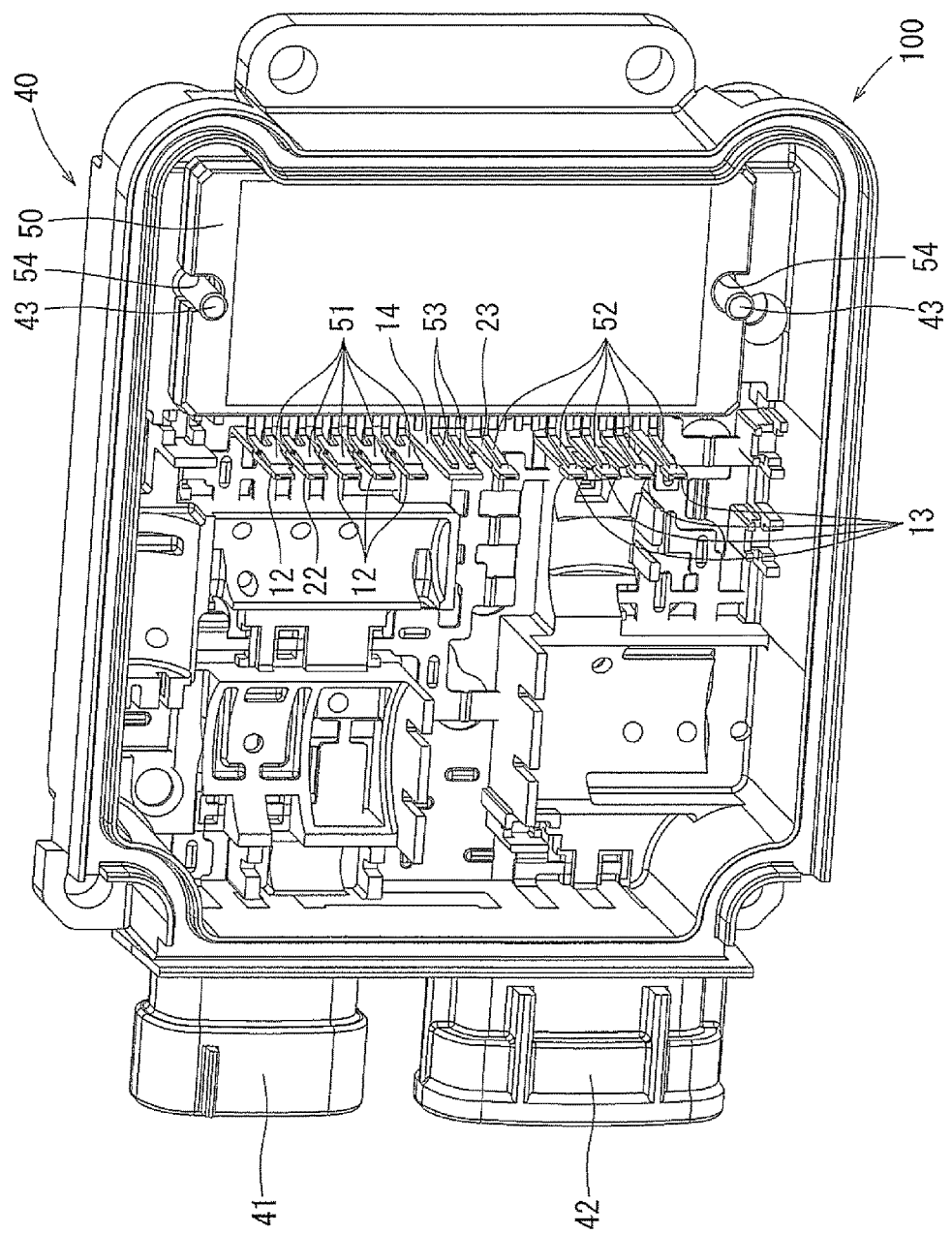
FIG. 1 is a perspective view of an electronic control device according to a first embodiment that includes an integrated circuit and a wiring unit having conductive members.

Referring to the drawings, FIG. 1 shows an electronic control device 100 according to a first embodiment that includes a wiring unit 40 and an integrated circuit chip (IC) 50 (corresponding to an integrated circuit in this disclosure). The wiring unit 40 has bus bar terminals 12, 13, 22, 23, which are connected to leads 51, 52 of the IC 50, respectively.

The wiring unit 40 includes a first conductive member 10 and a second conductive member 20 (see FIG. 2), which constitute a wiring of an electronic circuit of the wiring unit 40 and each of which is formed in a plate shape. Each of the first and second conductive members 10, 20 is formed by punching a square copper plate. The wiring unit 40 is made by layering the first and second conductive members 10, 20 with a predetermined space therebetween and integrally molding a resin material with the conductive members 10, 20 such that the first and second conductive members 10, 20 are partially buried in the wiring unit 40. The wiring unit 40 is formed in a box-like shape having an upper opening and is shaped to fully cover each outer circumference of the first and second conductive members 10, 20. The first conductive member 10 has the bus bar terminals 12, 13, whereas the second conductive member 20 has the bus bar terminals 22, 23. The bus bar terminals 12, 13, 22, 23 of the first and second conductive members 10, 20 of the wiring unit 40 are connected to the IC 50. Further, the electronic control device 100 includes various electronic components (not shown), such as a capacitor, therein such that the electronic components can be connected to various connection points of the first and second conductive members 10, 20. The wiring unit 40 has support rods 43 (each corresponding to a support part in this disclosure) extending upward and configured to hold the IC 50 on the wiring unit 40. The wiring unit 40 includes connectors 41, 42 protruding outward from a side wall of the wiring unit 40 and configured to connect the electronic circuit of the wiring unit 40 to an electronic circuit of another device. Further, the electronic control device 100 has a lid (not shown) for closing the upper opening of the wiring unit 40 such that the first and second conductive members 10, 20, the IC 50 and the electronic components are covered with the wiring unit 40 and the lid.

Figure 2:
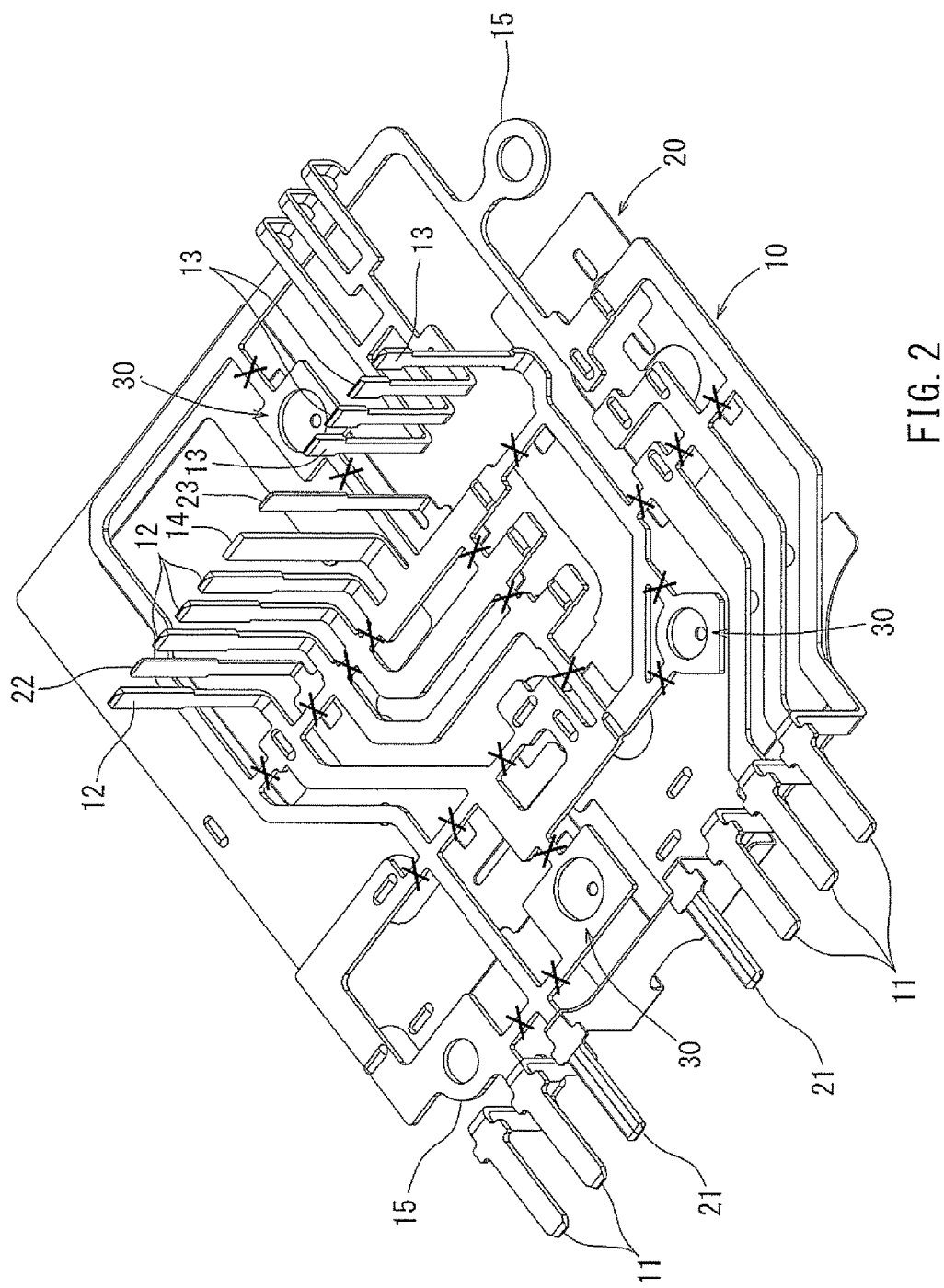
FIG. 2 is a perspective view of the conductive members.

FIG. 2 shows the first and second conductive members 10, 20 before they are buried in the wiring unit 40. The first conductive member 10 includes a wiring part serving as both a power line and signal lines of the electronic circuit, whereas the second conductive member 20 also includes a wiring part for a bottom side line. The first conductive member 10 is thicker than the second conductive member 20. In this embodiment, the first conductive member 10 has the plate thickness of 0.64 mm, whereas the second conductive member 20 has the plate thickness of 0.3 mm. The second conductive member 20 has a larger surface area than the first conductive member 10.

The first conductive member 10 has a plurality of terminals each extending from the wiring part of the first conductive member 10. Some of the terminals are connector terminals 11 configured to extend in each of the connectors 41, 42, and some of the terminals are the bus bar terminals 12, 13 to be connected to the leads 51, 52 of the IC 50. Thus, the connector terminals 11 are bent to shift upward such that the connector terminals 11 are positioned at the center of the connectors 41, 42 in the vertical direction, respectively. The bus bar terminals 12, 13 are bent upward such that the bus bar terminals 12, 13 protrude perpendicular to a basal plane where the wiring part of the first conductive member 10 extends horizontally. Further, the first conductive member 10 has a pair of positioning parts 15 integrated with the wiring part of the first conductive member 10 in order to position the first conductive member 10 within a molding die during insert molding. One of the positioning parts 15 is formed at a corner of the first conductive member 10 and near the connector terminals 11, and the other is formed near the bus bar terminals 13.

The second conductive member 20 is formed to have a larger surface area than the first conductive member 10 in order to widely cover the wiring part of the first conductive member 10 in a condition where the first and second conductive members 10, 20 are layered (e.g., FIG. 2). The second conductive member 20 has a plurality of terminals. Some of the terminals of the second conductive member 20 are connector terminals 21, which are bent to be aligned with the connector terminals 11 of the first conductive member 10 within each of the connectors 41, 42. Some of the terminals of the second conductive member 20 are the bus bar terminals 22, 23, which are bent to be aligned with the bus bar terminals 12, 13 of the first conductive member 10, respectively, and are configured to be connected to the leads 51, 52 of the IC 50. Because the second conductive member 20 is thinner than the first conductive member 10 as described above, each of the connector terminals 21 is folded in two to have the substantial same thickness with the connector terminals 11.

The first conductive member 10 has a dummy terminal 14 between the bus bar terminals 12, 22, which are configured to be connected to the leads 51 of the IC 50, and the bus bar terminals 13, 23, which are configured to be connected to the leads 52 of the IC 50. The dummy terminal 14 is bent to be aligned in parallel with the bus bar terminals 12. The dummy terminal 14 is wider than the bus bar terminals 12, 22. In this embodiment, each of the bus bar terminals 12, 22 has the width of 2 mm, whereas the dummy terminal 14 may have the width from 5 mm to 6 mm. The dummy terminal 14 is connected to a dummy lead 53 of the IC 50 in order to mechanically fix the IC 50 and not to electrically connect to an electronic circuit of the IC 50, including a power source circuit and a signal circuit. That is, the dummy lead 53 of the IC 50 is not electrically linked to the electronic circuit within the IC 50 and is merely mechanically coupled to the IC 50.

As shown in FIG. 2, the first conductive member 10 includes protrusions 30. The protrusions 30 are formed by partially stretching a surrounding area of the wiring part when punching the square copper plate. The protrusions 30 are located at three positions in the basal plane of the first conductive member 10, in more detail, at a first position near the connector terminals 21 of the connectors 41, 42, a second position near the connector terminals 11 of the connector 42, and a third position near the bus bar terminals 23. Each of the protrusions 30 is formed in a hollow cylindrical shape extending toward the second conductive member 20 such that a tip surface of each protrusion 30 is in surface contact with the second conductive member 20. Further, the tip surface of each protrusion 30 is bound to the second conductive member 20 in order to integrate the first and second conductive members 10, 20 with each other.

Figure 6:
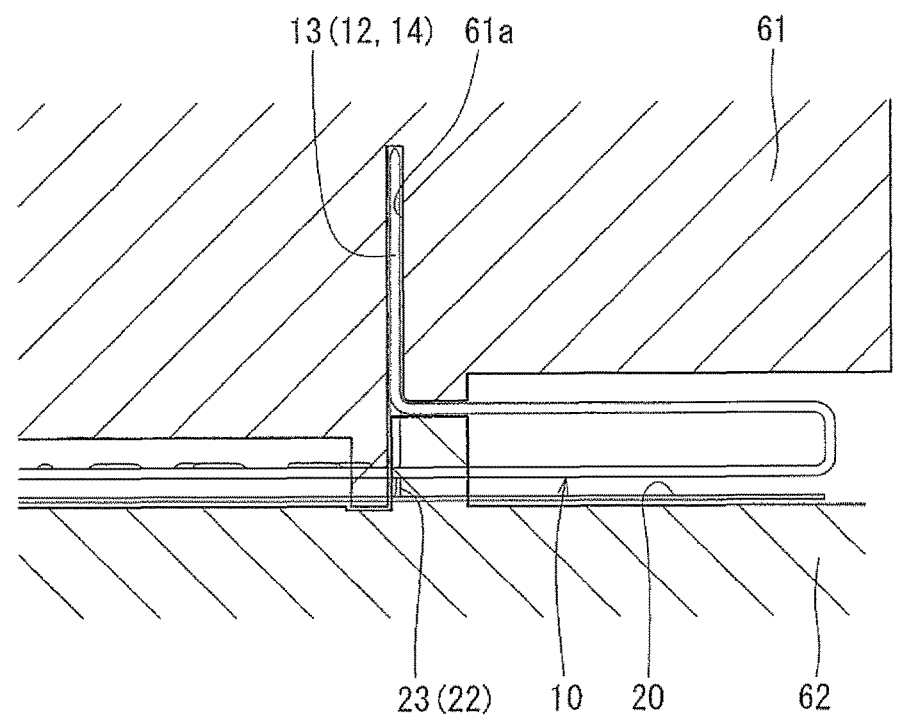
FIG. 6 is a cross-sectional view of a molding die holding the conductive members therein for insert molding of the electronic control device.

For the insert molding of the wiring unit 40, the first and second conductive members 10, 20, which are layered with the protrusions 30 located therebetween and are integrated with each other, are held as an insert material between an upper mold 61 and a lower mold 62, constituting the molding die, as shown in FIG. 6. In this condition, positioning of the first and second conductive members 10, 20 with respect to the upper mold 61 and the lower mold 62 is carried out by using the positioning parts 15 of the first conductive member 10. Each of the bus bar terminals 12, 13, 22, 23 and the dummy terminal 14 is divided into a leading end section extending upward from its bent position and a basal end section extending horizontally from the bent position. The leading end sections of the bus bar terminals 12, 13, 22, 23 and the dummy terminal 14 are inserted into an engaging groove 61*a* of the upper mold 61. Whereas, the basal end sections of the bus bar terminals 12, 13, 22, 23 and the dummy terminal 14 are supported between the upper mold 61 and the lower mold 62. Thus, the bus bar terminals 12, 13, 22, 23 and the dummy terminal 14 are positioned with respect to the upper mold 61 and the lower mold 62.

During the insert molding, a space between the upper mold 61 and the lower mold 62 is filled with a resin material by injecting the material into the space in order to form the wiring unit 40 in which the first and second conductive members 10, 20 are fixed. The molded wiring unit 40 has the support rods 43 extending upward for holding the IC 50 on the wiring unit 40. Because the bus bar terminals 12, 13, 22,

23 and the dummy terminal 14 of the first and second conductive members 10, 20 are positioned relative to the upper mold 61 and the lower mold 62 during the insert molding as described above, the support rods 43, formed near the bus bar terminals 12, 13, 22, 23 and the dummy terminal 14, can be arranged in the predetermined installation positions relative to the bus bar terminals 12, 13, 22, 23 and the dummy terminal 14. Here, during the insert molding, the first and second conductive members 10, 20 serving as the insert material are subjected to pressure caused by flow of the resin material. However, the protrusions 30 integrate the first and second conductive members 10, 20 with each other in a parallel condition with the predetermined distance therebetween, so that the wiring unit 40 is integrally molded with the first and second conductive members 10, 20 such that the first and second conductive members 10, 20 are kept in such parallel condition.

After molding the wiring unit 40, reinforcing connections of the wiring part of the first conductive member 10 are cut for forming the electronic circuit of the wiring unit 40. While, the protrusions 30 are cut away from the wiring part of the first conductive member 10. In FIG. 2, each of these cutting sites is indicated by "X". Here, it is important that these cutting sites are cut after insert molding. When the first conductive member 10 are cut at the cutting sites, the stiffness of the wiring part of the first conductive member 10 becomes low. Thus, if the cutting sites are cut before the insert molding, there is a possibility that the first conductive member 10 moves during the insert molding due to the flow pressure of the resin material, thereby resulting in an undesirable contact between lines formed in the wiring part of the first conductive member 10. Accordingly, the reinforcing connections of the first conductive member 10 prevent such undesirable contact between the lines of the wiring unit, and thus can reduce defective products during the insert molding.

Figure 3:
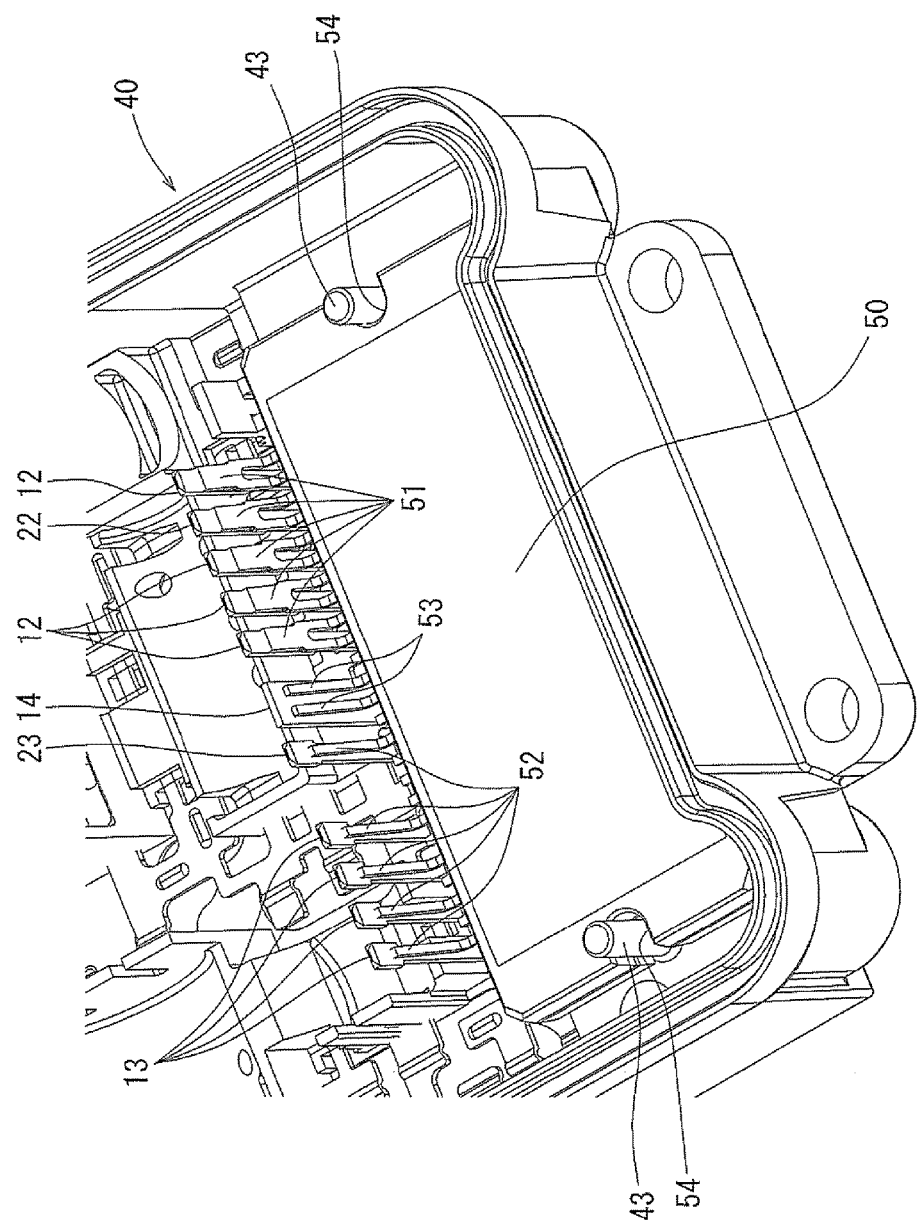
FIG. 3 is a perspective view of a part of the electronic control device of FIG. 1.
Figure 4:
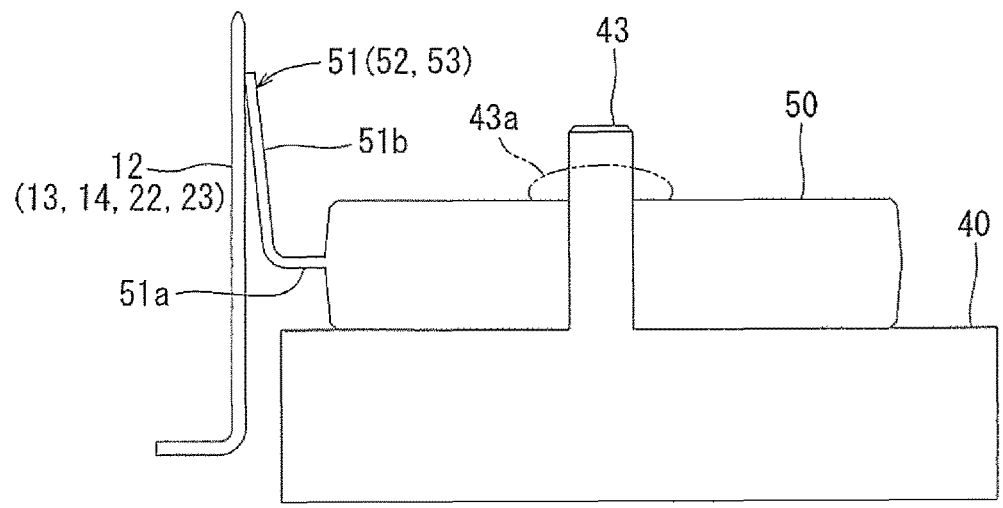
FIG. 4 is a schematic view of a connection between a lead of the integrated circuit and a bus bar terminal of the wiring unit.

The electronic control device 100 is made by connecting the IC 50 and other electronic components to the first and second conductive members 10, 20 of the wiring unit 40. In such process, the IC 50 is connected to the bus bar terminals 12, 13, 22, 23 and the dummy terminal 14. The IC 50 has a plurality of external connection terminals including the leads 51, 52 and the dummy leads 53 as shown in FIGS. 1, 3 and 4. The leads 51 are connected to the power source circuit of the IC 50, whereas the leads 52 are connected to the signal circuit of the IC 50. Each of the leads 51, 52 and the dummy leads 53 has a base end section 51a and a leading end section 51b. In a condition where the leads 51, 52 and the dummy leads 53 of the IC 50 are connected to the bus bar terminals 12, 13, 22, 23 and the dummy terminal 14, respectively, each base end section 51a extends from a side surface of the IC 50 in parallel to the flat planes of the first and second conductive members 10, 20 of the wiring unit 40, whereas each leading end section 51b extends upward from a leading edge of the base end section 51a and along corresponding one of the bus bar terminals 12, 13, 22, 23 and the dummy terminal 14 such that an upper edge of the leading end section 51b is coupled to the corresponding one of the bus bar terminals 12, 13, 22, 23 and the dummy terminal 14. In each of the bus bar terminals 12, 13, 22, 23 and the dummy terminal 14, the base end section 51a is shorter than the leading end section 51b. The height of each upper edge of the leading end sections 51b from the basal plane of the first conductive member 10 is greater than the height of an upper surface of an outer case of the IC 50 from the basal plane. Further, in a condition where the IC 50 is fixed on the wiring unit 40, each leading end section 51b of the leads 51, 52 and the dummy leads 53 extends in a direction non-parallel to the bus bar terminals 12, 13, 22, 23 and the dummy terminal 14 such that the leading edges of the leading end sections 51b contact upper ends of the bus bar terminals 12, 13, 22, 23 and the dummy terminal 14, respectively. Further, the leading edges of the leading end sections 51b are fixed to side surfaces of the upper ends of the bus bar terminals 12, 13, 22, 23 and the dummy terminal 14, respectively.

Figure 5:
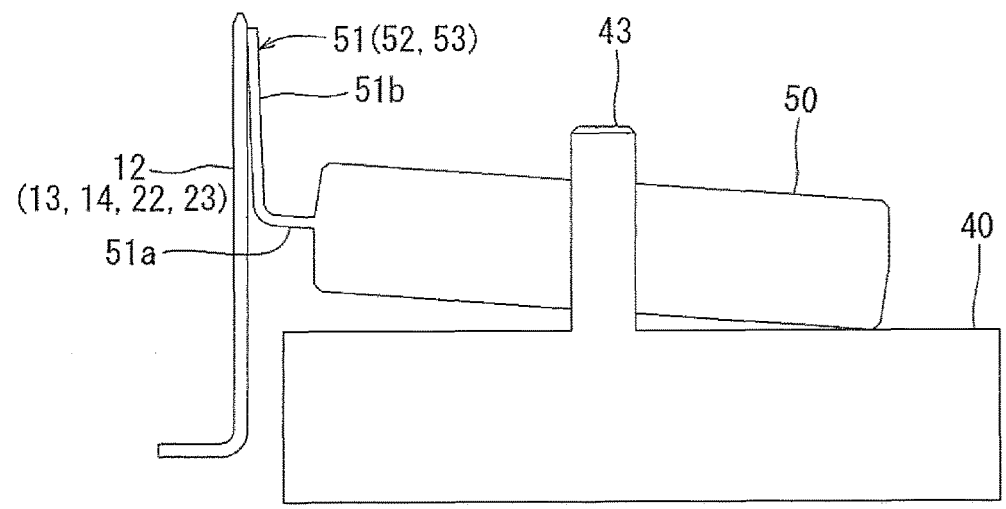
FIG. 5 is a schematic view of the connection between the lead and the bus bar terminal, wherein the integrated circuit is not completely placed on the wiring unit.

A process of connecting the IC 50 to the wiring unit 40 will be described. First, the support rods 43 of the wiring unit 40 are inserted into the engaging grooves 54 of the IC 50 such that the IC 50 is placed on the wiring unit 40. Because the support rods 43 are formed in the predetermined installation position relative to the bus bar terminals 12, 13, 22, 23 and the dummy terminal 14 as described above, when inserting the support rods 43 into the engaging grooves 54 of the IC 50, the leads 51, 52 and the dummy leads 53 contact the bus bar terminals 12, 13, 22, 23 and the dummy terminal 14, respectively, as illustrated in FIG. 5. The leads 51, 52 and the dummy leads 53 are shaped to incline toward and to contact the side surfaces of the upper ends of the bus bar terminals 12, 13, 22, 23 and the dummy terminal 14, respectively, in a condition where the IC 50 is fixed on the wiring unit 40. Accordingly, when inserting the support rods 43 of the wiring unit 40 into the engaging grooves 54 of the IC 50, an entire lower surface of the IC 50 does not completely contact an upper surface of the wiring unit 40 due to contact between at least one of the bus bar terminals 12, 13, 22, 23 and the dummy terminal 14 and at least one of the leads 51, 52 and the dummy leads 53. In such condition, a half of the IC 50 connected to the leads 51, 52 and the dummy leads 53 does not contact the upper surface of the wiring unit 40, whereas the other half of the IC 50 contacts the upper surface of the wiring unit 40 as shown in FIG. 5. In order to completely contact the lower surface of the IC 50 with the upper surface of the wiring unit 40 as shown in FIG. 4, an upper surface of the IC 50 is pressed downward. And then, upper ends of the support rods 43 are deformed by thermal caulking. Hence, a larger diameter structure 43a is formed at each upper end of the support rods 43 in order to hold the IC 50 on the wiring unit 40. In this state, the leads 51, 52 and the dummy leads 53 are in pressure contact with the bus bar terminals 12, 13, 22, 23 and the dummy terminal 14, respectively. Thus, the IC 50 is forced in a direction away from the bus bar terminals 12, 13, 22, 23 and the dummy terminal 14, so that a part of an inner surface of each engaging groove 54 of the IC 50, which is closer to the leads 51, 52 and the dummy leads 53, contacts the corresponding support rod 43.

In a condition where the IC 50 is completely placed on the wiring unit 40 and where the leads 51, 52 and the dummy leads 53 contact the bus bar terminals 12, 13, 22, 23 and the dummy terminal 14, respectively, the leads 51, 52 and the dummy leads 53 are coupled to the bus bar terminals 12, 13, 22, 23 and the dummy terminal 14 by welding, respectively. Hence, even if the IC 50 is not sufficiently fixed on the wiring unit 40 by the larger diameter structures 43a of the support rods 43, the IC 50 is strongly fixed on the wiring unit 40 due to welding connections of the leads 51, 52 and the dummy leads 53 to the bus bar terminals 12, 13, 22, 23 and the dummy terminal 14. In particular, the dummy terminal 14 and the dummy leads 53 are formed to make a high mechanical strength connection, which does not have an electric connection capability and solely acts as mechanical connection, so that engagement of the leads 51, 52 and the dummy leads 53 to the bus bar terminals 12, 13, 22, 23 and the dummy terminal 14 can strongly secure the IC 50 to the wiring unit 40.

As described above, the first and second conductive members 10, 20 are held between the upper mold 61 and the lower mold 62 during the insert molding by engaging the bus bar terminals 12, 13, 22, 23 and the dummy terminal 14, which have been bent, with the upper mold 61. Thus, positional displacements of the bus bar terminals 12, 13, 22, 23 and the dummy terminal 14 during the insert molding can be prevented. Further, positional deviations of the support rods 43 relative to the bus bar terminals 12, 13, 22, 23 and the dummy terminal 14 can be prevented as described above, so that the IC 50 can be held without any positional deviation relative to the bus bar terminals 12, 13, 22, 23 and the dummy terminal 14. Accordingly, a loose connection of the bus bar terminals 12, 13, 22, 23 and the dummy terminal 14 to the leads 51, 52 and the dummy leads 53 and/or application of excessive force to the IC 50 via the leads 51, 52 and the dummy leads 53 is prevented. In addition, the leads 51, 52 of the IC 50 extend in a direction away from the basal plane of the first conductive member 10, so that the leads 51, 52 are connected to the bus bar terminals 12, 13 at an upper side of the wiring unit 40. Thus, a process for connecting the leads 51, 52 to the bus bar terminals 12, 13 can be easily performed.

Even if the IC 50 is fixed on the wiring unit 40 at a position deviated from a predetermined installation position, contact angles of the leads 51, 52 and the dummy leads 53 with respect to the bus bar terminals 12, 13, 22, 23 and the dummy terminal 14 can vary. Hence, the bus bar terminals 12, 13, 22, 23 and the dummy terminal 14 can be certainly coupled to the leads 51, 52 and the dummy leads 53, respectively, so that reliability of connections of the leads 51, 52 to the bus bar terminals 12, 13, 22, 23 can be improved.

Further, regarding each of the leads 51, 52 of the IC 50, the base end section 51a is shorter than the leading end section 51b. Thus, a decrease in the reliability of the connections of the leads 51, 52 to the bus bar terminals 12, 13, 22, 23, caused by the deviation of the IC 50 relative to the bus bar terminals 12, 13, 22, 23, can be prevented without increasing the size of the wiring unit 40.

In addition, the connection between the dummy leads 53 and the dummy terminal 14 can mechanically fix the IC 50 on the wiring unit 40. Hence, the fixing strength of the IC 50 on the wiring unit 40 is increased, thereby improving the reliability of the connections of the leads 51, 52 to the bus bar terminals 12, 13, 22, 23.

Figure 7:
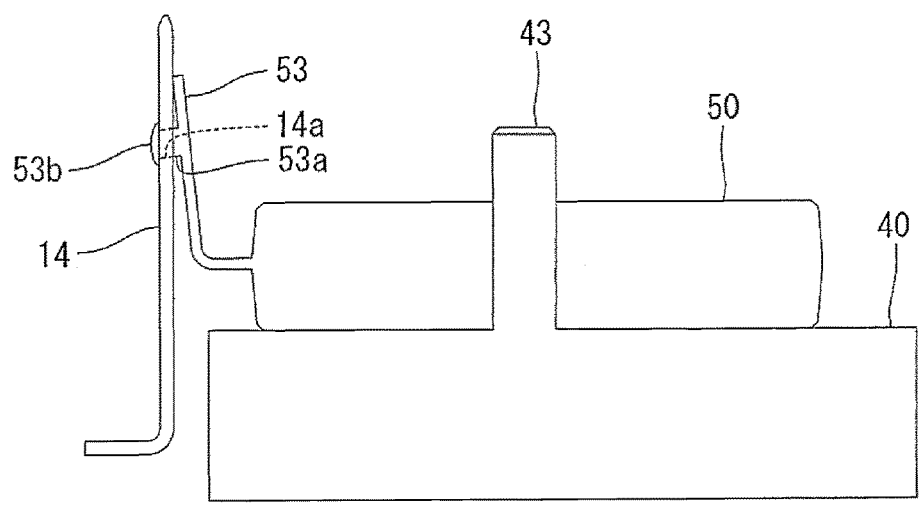
FIG. 7 is a schematic view of a connection between a dummy lead of the integrated circuit and a dummy terminal according to a second embodiment.

FIG. 7 shows a second embodiment of this disclosure. In the second embodiment, the dummy terminal 14 and the dummy leads 53 are coupled to each other by swaging instead of welding. Other configurations of the second embodiment are same with those of the first embodiment, and thus will not be described again.

The dummy terminal 14 has a through hole 14a near the upper end. Each of the dummy leads 53 has a projection 53a to be inserted into the through hole 14a. In the assembly process, the projections 53a are inserted into the through hole 14a such that tips of the projections 53a pass through the through hole 14a, and then each tip of the projections 53a is deformed by swaging in order to form a larger diameter structure 53b. Thus, the larger diameter structures 53b prevent the projections 53a from removing from the through hole 14a, so that the dummy terminal 14 and the dummy leads 53 can be strongly coupled to each other.

The present disclosure can be further modified. For example, the fixing strength of the IC 50 with respect to the wiring unit 40 may be increased by enhancing the fixing strength of the leads 51, 52 to the bus bar terminals 12, 13, 22, 23 without the dummy terminal 14 and the dummy leads 53. Alternatively, the number of the dummy terminal 14 and the dummy leads 53 may be increased in order to enhance the fixing strength between the IC 50 and the wiring unit 40. Further, although the IC 50 in each of the above-described embodiments has the leads 51, 52 and the dummy leads 53 at one side surface of the IC 50 formed in a rectangular cuboidal shape, the IC 50 may have leads including dummy leads at two opposite side surfaces or at four side surfaces.

What is claimed is:

1. An electronic control device, comprising:
   a wiring unit made from a resin material and including a conductive member partially buried therein, the conductive member having a bus bar terminal and a wiring part extending along a basal plane, the bus bar terminal being bent to extend in a first direction intersecting the basal plane; and
   an integrated circuit placed on the wiring unit and having a lead directed away from the basal plane, the lead being connected to the bus bar terminal.

2. The electronic control device of claim 1, wherein the wiring unit includes a support part holding the integrated circuit on the wiring unit.

3. The electronic control device of claim 1,
   wherein the lead extends in a second direction intersecting the first direction; and
   wherein the lead is coupled to a side surface of the bus bar terminal.

4. The electronic control device of claim 3,
   wherein the lead includes a base end section extending substantially parallel to the basal plane and a leading end section extending in the second direction;
   wherein the base end section is shorter than the leading end section; and
   wherein the leading end section is coupled to the bus bar terminal at a position, the height of which from the basal plane is greater than the height of an upper surface of the integrated circuit from the basal plane.

5. The electronic control device of claim 1,
   wherein the conductive member of the wiring unit has a dummy terminal aligned with the bus bar terminal; and
   wherein the integrated circuit includes a dummy lead aligned with the lead and coupled to the dummy terminal.

6. The electronic control device of claim 5, wherein the dummy lead is coupled to the dummy terminal by welding.

7. The electronic control device of claim 5, wherein the dummy lead is coupled to the dummy terminal by swaging of the dummy lead.

8. The electronic control device of claim 5, wherein the dummy lead is electrically unconnected to an electronic circuit in the integrated circuit.

9. The electronic control device of claim 5, wherein the width of the dummy terminal is greater than that of the bus bar terminal.

10. The electronic control device of claim 1, wherein the first direction is perpendicular to the basal plane.

11. A method of manufacturing an electronic control device, comprising the steps of:
    (a) bending a bus bar terminal of a conductive member in a crossing direction intersecting a basal plane, wherein a wiring part of the conductive member extends along the basal plane;

(b) engaging a part of the bus bar terminal, which extends in the crossing direction, with a molding die in order to hold the conductive member within the molding die;
(c) injecting a resin material into the molding die in order to mold a wiring unit including the conductive member partially buried therein;
(d) placing an integrated circuit on the wiring unit such that a lead of the integrated circuit is directed away from the basal plane; and
(e) connecting the bus bar terminal to the lead at a position, wherein the height of the position from the basal plane is greater than the height of an upper surface of the integrated circuit from the basal plane.

* * * * *